(12) United States Patent
Zheng

(10) Patent No.: US 8,239,736 B2
(45) Date of Patent: Aug. 7, 2012

(54) METHOD FOR ENHANCING RELIABILITY OF INFORMATION TRANSMISSION

(75) Inventor: Liangde Zheng, Shenzhen (CN)

(73) Assignee: Shenzhen HYT Science & Technology Co., Ltd., Nanshan District, Shenzhen (CN)

( * ) Notice: Subject to any disclaimer, the term of this patent is extended or adjusted under 35 U.S.C. 154(b) by 675 days.

(21) Appl. No.: 12/514,580

(22) PCT Filed: Aug. 11, 2008

(86) PCT No.: PCT/CN2008/071942
§ 371 (c)(1),
(2), (4) Date: May 12, 2009

(87) PCT Pub. No.: WO2009/062417
PCT Pub. Date: May 22, 2009

(65) Prior Publication Data
US 2010/0318883 A1      Dec. 16, 2010

(30) Foreign Application Priority Data
Nov. 16, 2007   (CN) .......................... 2007 1 0124571

(51) Int. Cl.
H03M 13/00 (2006.01)
(52) U.S. Cl. ........ 714/774; 714/701; 714/777; 714/762; 714/788; 714/752

(58) Field of Classification Search .................. 714/774, 714/777, 762, 788, 701, 752
See application file for complete search history.

(56) References Cited

U.S. PATENT DOCUMENTS

| | | | | | |
|---|---|---|---|---|---|
| 5,283,780 | A | * | 2/1994 | Schuchman et al. | 370/312 |
| 6,701,468 | B1 | * | 3/2004 | Yamazaki et al. | 714/702 |
| 7,020,823 | B2 | * | 3/2006 | Bushmitch et al. | 714/752 |
| 7,640,462 | B2 | * | 12/2009 | Lin | 714/701 |
| 2003/0167436 | A1 | * | 9/2003 | Ha et al. | 714/756 |

* cited by examiner

Primary Examiner — Guy Lamarre
(74) Attorney, Agent, or Firm — Global IP Services; Tiamhua Gu

(57) ABSTRACT

The present invention provides a method for enhancing reliability of information transmission by (a) establishing a matrix based on the length of bits of valid information in frame time slots; and creating a new matrix by presetting Error Correction Coding (ECC) for rows and columns of said matrix; (b) adopting the 1st Interleaving method to re-allocate bits which have been processed twice by using said ECC in said new matrix, to both ends of said frame time slots; and (c) adopting the 2nd Interleaving method to re-allocate the remaining bits in said new matrix to the middle of said frame time slots. After processed like this, the anti-interfering ability of the bits at both ends of TDMA frame time slot can be significantly enhanced, and the bit-error rate is decreased most, and all redundancy bits of Hamming codes can be arrayed at both ends of TDMA frame time slot.

9 Claims, 6 Drawing Sheets

| Bit Name | Index | Interleave Index | Bit Name | Index | Interleave Index | Bit Name | Index | Interleave Index |
|---|---|---|---|---|---|---|---|---|
| R(3) | 0 | 0 | I(49) | 66 | 186 | H_R9(3) | 132 | 176 |
| R(2) | 1 | 181 | I(48) | 67 | 171 | H_R9(2) | 133 | 161 |
| R(1) | 2 | 166 | I(47) | 68 | 156 | H_R9(1) | 134 | 146 |
| R(0) | 3 | 151 | I(46) | 69 | 141 | H_R9(0) | 135 | 131 |
| I(95) | 4 | 136 | I(45) | 70 | 126 | H_C1(3) | 136 | 116 |
| I(94) | 5 | 121 | I(44) | 71 | 111 | H_C2(3) | 137 | 101 |
| I(93) | 6 | 106 | H_R5(3) | 72 | 96 | H_C3(3) | 138 | 86 |
| I(92) | 7 | 91 | H_R5(2) | 73 | 81 | H_C4(3) | 139 | 71 |
| I(91) | 8 | 76 | H_R5(1) | 74 | 66 | H_C5(3) | 140 | 56 |
| I(90) | 9 | 61 | H_R5(0) | 75 | 51 | H_C6(3) | 141 | 41 |
| I(89) | 10 | 46 | I(43) | 76 | 36 | H_C7(3) | 142 | 26 |
| I(88) | 11 | 31 | I(42) | 77 | 21 | H_C8(3) | 143 | 11 |
| H_R1(3) | 12 | 16 | I(41) | 78 | 6 | H_C9(3) | 144 | 192 |
| H_R1(2) | 13 | 1 | I(40) | 79 | 187 | H_C10(3) | 145 | 177 |
| H_R1(1) | 14 | 182 | I(39) | 80 | 172 | H_C11(3) | 146 | 162 |
| H_R1(0) | 15 | 167 | I(38) | 81 | 157 | H_C12(3) | 147 | 147 |
| I(87) | 16 | 152 | I(37) | 82 | 142 | H_C13(3) | 148 | 132 |
| I(86) | 17 | 137 | I(36) | 83 | 127 | H_C14(3) | 149 | 117 |
| I(85) | 18 | 122 | I(35) | 84 | 112 | H_C15(3) | 150 | 102 |
| I(84) | 19 | 107 | I(34) | 85 | 97 | H_C1(2) | 151 | 87 |
| I(83) | 20 | 92 | I(33) | 86 | 82 | H_C2(2) | 152 | 72 |
| I(82) | 21 | 77 | H_R6(3) | 87 | 67 | H_C3(2) | 153 | 57 |
| I(81) | 22 | 62 | H_R6(2) | 88 | 52 | H_C4(2) | 154 | 42 |
| I(80) | 23 | 47 | H_R6(1) | 89 | 37 | H_C5(2) | 155 | 27 |
| I(79) | 24 | 32 | H_R6(0) | 90 | 22 | H_C6(2) | 156 | 12 |
| I(78) | 25 | 17 | I(32) | 91 | 7 | H_C7(2) | 157 | 193 |
| I(77) | 26 | 2 | I(31) | 92 | 188 | H_C8(2) | 158 | 178 |
| H_R2(3) | 27 | 183 | I(30) | 93 | 173 | H_C9(2) | 159 | 163 |
| H_R2(2) | 28 | 168 | I(29) | 94 | 158 | H_C10(2) | 160 | 148 |
| H_R2(1) | 29 | 153 | I(28) | 95 | 143 | H_C11(2) | 161 | 133 |
| H_R2(0) | 30 | 138 | I(27) | 96 | 128 | H_C12(2) | 162 | 118 |
| I(76) | 31 | 123 | I(26) | 97 | 113 | H_C13(2) | 163 | 103 |
| I(75) | 32 | 108 | I(25) | 98 | 98 | H_C14(2) | 164 | 88 |
| I(74) | 33 | 93 | I(24) | 99 | 83 | H_C15(2) | 165 | 73 |

FIG. 4a

| | | | | | | | | |
|---|---|---|---|---|---|---|---|---|
| I(73) | 34 | 78 | I(23) | 100 | 68 | H_C1(1) | 166 | 58 |
| I(72) | 35 | 63 | I(22) | 101 | 53 | H_C2(1) | 167 | 43 |
| I(71) | 36 | 48 | H_R7(3) | 102 | 38 | H_C3(1) | 168 | 28 |
| I(70) | 37 | 33 | H_R7(2) | 103 | 23 | H_C4(1) | 169 | 13 |
| I(69) | 38 | 18 | H_R7(1) | 104 | 8 | H_C5(1) | 170 | 194 |
| I(68) | 39 | 3 | H_R7(0) | 105 | 189 | H_C6(1) | 171 | 179 |
| I(67) | 40 | 184 | I(21) | 106 | 174 | H_C7(1) | 172 | 164 |
| I(66) | 41 | 169 | I(20) | 107 | 159 | H_C8(1) | 173 | 149 |
| H_R3(3) | 42 | 154 | I(19) | 108 | 144 | H_C9(1) | 174 | 134 |
| H_R3(2) | 43 | 139 | I(18) | 109 | 129 | H_C10(1) | 175 | 119 |
| H_R3(1) | 44 | 124 | I(17) | 110 | 114 | H_C11(1) | 176 | 104 |
| H_R3(0) | 45 | 109 | I(16) | 111 | 99 | H_C12(1) | 177 | 89 |
| I(65) | 46 | 94 | I(15) | 112 | 84 | H_C13(1) | 178 | 74 |
| I(64) | 47 | 79 | I(14) | 113 | 69 | H_C14(1) | 179 | 59 |
| I(63) | 48 | 64 | I(13) | 114 | 54 | H_C15(1) | 180 | 44 |
| I(62) | 49 | 49 | I(12) | 115 | 39 | H_C1(0) | 181 | 29 |
| I(61) | 50 | 34 | I(11) | 116 | 24 | H_C2(0) | 182 | 14 |
| I(60) | 51 | 19 | H_R8(3) | 117 | 9 | H_C3(0) | 183 | 195 |
| I(59) | 52 | 4 | H_R8(2) | 118 | 190 | H_C4(0) | 184 | 180 |
| I(58) | 53 | 185 | H_R8(1) | 119 | 175 | H_C5(0) | 185 | 165 |
| I(57) | 54 | 170 | H_R8(0) | 120 | 160 | H_C6(0) | 186 | 150 |
| I(56) | 55 | 155 | I(10) | 121 | 145 | H_C7(0) | 187 | 135 |
| I(55) | 56 | 140 | I(9) | 122 | 130 | H_C8(0) | 188 | 120 |
| H_R4(3) | 57 | 125 | I(8) | 123 | 115 | H_C9(0) | 189 | 105 |
| H_R4(2) | 58 | 110 | I(7) | 124 | 100 | H_C10(0) | 190 | 90 |
| H_R4(1) | 59 | 95 | I(6) | 125 | 85 | H_C11(0) | 191 | 75 |
| H_R4(0) | 60 | 80 | I(5) | 126 | 70 | H_C12(0) | 192 | 60 |
| I(54) | 61 | 65 | I(4) | 127 | 55 | H_C13(0) | 193 | 45 |
| I(53) | 62 | 50 | I(3) | 128 | 40 | H_C14(0) | 194 | 30 |
| I(52) | 63 | 35 | I(2) | 129 | 25 | H_C15(0) | 195 | 15 |
| I(51) | 64 | 20 | I(1) | 130 | 10 | | | |
| I(50) | 65 | 5 | I(0) | 131 | 191 | | | |

FIG. 4b

METHOD FOR ENHANCING RELIABILITY OF INFORMATION TRANSMISSION

CROSS REFERENCE TO RELATED PATENT APPLICATION

This patent application is the US national stage of PCT/CN2008/071942 filed on Aug. 11, 2008, which claims the priority of the Chinese patent application No. 200710124571.6 filed on Nov. 16, 2007, that application is incorporated herein by reference.

BACKGROUND OF THE INVENTION

1. Field of the Invention

The present invention relates to a method for enhancing reliability of information transmission in TDMA wireless communication system, and more particularly, in a low-rate TDMA system.

2. Description of the Prior Art

In TDMA-based digital wireless communication system, carriers are transmitted in time slots of various length (for example 30 ms). One burst structure is transmitted within a time slot, and there are certain guard intervals between different time slots.

Data are transmitted within frame time slots by TDMA transmitters. At the beginning of transmission, transmission power of carriers on time slots will be increased continually and then be kept at a steady state, and at the end of the transmission the transmission power will be decreased continually and then be kept a steady state. This process keeps repeating during communicating with the transmitter.

For the voltage controlled oscillator (VCO), there needs time period to control the process of the power increasing and decreasing within frame time slots, during which the signals are not stable. It is very easy to interfere these instable signals to cause errors in decoding. Meanwhile, adjacent channel interference may be resulted therefrom, and thus the normal operation of other systems may be affected. In particular, with regard to TDMA system which requires fast-speed power switch, such phenomenon, as well as effects on the whole system becomes even more obvious.

With regard to TDMA wireless communication system, distribution of power increasing and decreasing during the frame time slot is shown as FIG. 1, and here, given that its time slot is 30 ms.

FIG. 1 illustrates the relationship of power with time in a time slot in a TDMA wireless communication system. The time slot of 30 ms is divided into 3 regions. Region A represents a power increase stage, which duration is related with VCO performance. The increase time may be less than or equal to 1.5 ms according to the current VCO accuracy. Region B represents a power-steady stage, which duration depends on the length of the time slot (27.5 ms as defined here). Region C represents a power decrease stage, with its duration around 1.5 ms. Generally, it is necessary to make the falling curve smooth for achieving a lower adjacent channel power, thus the power must be decreased at the rear end of Region B.

However, as for Region B, the performance of signals in the part may be affected by power decreasing in advance; and likely, the performance of signals at the front end may be impacted by the power fluctuation for smoothing increase curve. That is to say, owing to the inherent property of VCO power adjustment, the quality of signals at both ends of Region B will be degraded. And thus, probability of signal errors and bit error rate are higher than ever.

Therefore, specific measures should be taken to perform ECC protection on signals in both ends.

In the prior art, methods for protecting the signals at the both ends of Region B from degrading comprising the following step of:

Encoding data to be grouped in a frame at first by using BPTC. BPTC, namely short of Block Product Turbo Codes, is applied widely to error correcting coding on the link layer channel in wireless communication system. BPTC is a simple algorithm, in which the code words are arranged into a matrix, so as to provide a certain ECC (for example Hamming code) protection for rows and columns separately.

Taking it for example, supposing that the valid information bits to be transmitted are 96 bits, at first we need to encode the data by using BPTC (96, 196), which indicates that the information bits are 96 bits and the code words after encoded are 196 bits. The data are encoded in this way: add three zeros to the front of information bits for forming 99 bits; arrange the 99 bits in a 9×11 matrix; perform left-to-right error correction per row by Hamming codes (15, 11, 3) to get a 9×15 matrix; and go on with top-to-bottom error-correction per column by Hamming codes (13, 9, 3) to get a 11×15 matrix as shown in FIG. 2.

In FIG. 2, I (0)-I (95) are information bits, and H_R is the Error Correcting Code of Hamming codes (15, 11, 3), and H_C is the Error Correcting Code of Hamming codes (11, 9, 3).

As for the BPTC encode matrix formed in Step 1 of FIG. 2, it is needed to disarrange the bits by applying a certain interleaving method and then rearrange and transmit them in a certain sequence. Interleaving is applied to decentralize burst errors occurred during information transmission. Therefore, this method may help achieve reasonable re-allocation of error information occurred during power increase and power decrease on time slots per TDMA frame.

With reference to the prior art, the BPTC encode matrix (see FIG. 2) formed in Step 1 is interleaved and transmitted in the following order:

Firstly, rearrange rows of the matrix in FIG. 2 from left to right, and then the columns from top to bottom. Accordingly, decompose the 11×15 matrix into a 1×195 row vector. And FIG. 3 illustrates the decomposition and construction steps:

as for the 1×195 vector, the left side is the least significant bit, and the right the most. Suppose that the number of the index ranges 0~194, with each corresponding to R2~H_C15 (0), and the following interleaving formulas are adopted:

$$\text{Interleave Index} = \text{Index} \times 13 \text{ modulo } 196 \qquad (1)$$

Accordingly, the bit sequence is disarranged after such interleaving process. Check bits and information bits become mixed, and constitute a new transmission sequence, wherein the Error Correcting Code of Hamming code is most probably arranged at both ends of a frame time slot, thus enhancing the anti-interference capability of data in this part.

Certainly, there is not only the above interleaving formula. The interleaving formulas or the bit sequence may be modified to arrange the redundancy bits of the Error Correcting Code at both ends of the time slot in a frame for a better effect. For example, better effect can be attained by using the following formula:

$$\text{Interleave Index} = \text{Index} \times 181 \text{ modulo } 196 \qquad (2)$$

The final transmission sequence depends on the sequence of interleaved bits, i.e. the Interleave Index in Formulas 1 and 2. In the table accompanying the specification, the bit name, sequences before interleaving and after interleaving, and a corresponding relationship between these items are listed. Therefore, the bits will be transmitted according to the interleaved index.

In the prior art, the reliability of data at both ends of the frame time slots may be enhanced, and the bit-error rate may be decreased through encoding the valid information bits by using BPTC, providing error control using Hamming code for rows and columns, and arranging the ECC check bits as much as possible into the both ends on the frame time slots by using a certain convolution method.

Through such a technique data at both ends of frame time slots may be protected and the bit-error rate may be decreased. However, there are many defects to be improved:

(1) Incapable to enhance error correcting capability at the both ends of the frame time slots, as the example above, error correcting capability at both ends of frame time slots corresponds to that of Hamming code, which is not enhanced in fact;

(2) Incapable to arrange all redundancy bits at the both ends of the frame time slots through various interleaving methods. Here, some valid information bits will be still allocated into the both ends, which may increase the risk of error bit from valid information.

SUMMARY OF THE INVENTION

The subject matter of the present invention is directed to a method for enhancing information transmission reliability.

The solution which the present invention employs to solve its technical problems is to provide a method for enhancing information transmission reliability, comprising the following steps:

(a) establishing a matrix based on a length of valid information bits in frame time slots; and creating a new matrix by adding Error Correction Code (ECC) preset for rows and columns of said matrix respectively thereto;

(b) adopting the 1st Interleaving method to re-allocate bits which have been processed twice by using said ECC in said new matrix to both ends of said frame time slots; and (c) adopting the 2nd Interleaving method to re-allocate the remaining bits in said new matrix to the middle of said frame time slots.

In the present invention, the length of said valid information bits processed by using error correcting code in said Step (a) corresponds to the number of rows and columns of said matrix.

In the present invention, said step (b) further includes:

(b1) performing comparison between bits which have been processed twice by using ECC in said new matrix;

(b2) applying said 1st Interleaving method to bits processed twice by using said ECC in said new matrix in case of meeting with requirements; otherwise, ending the process.

In the present invention, said step (c) further includes:

(c1) arranging the remaining bits in said new matrix one by one in the order of left-to-right and top-to-bottom;

(c2) applying said 2nd Interleaving method to said remaining bits.

In this invention, Hamming code is employed.

The present invention providing said technical solution has the following advantages over the existing technique:

In the technical solution, the valid information bits are re-allocated into a matrix, on rows and columns of which Hamming coding is performed. Thus, some bits are processed twice by using Hamming code. Then, the twice processed bits are separated from the information bits, and disarranged by using 1st Interleaving method and arranged at the both ends of TDMA frame time slot (with being at VCO power rise/drop stage, the bits in this region can be easily interfered), meanwhile by adopting 2nd Interleaving method the remaining bits are arranged into the middle of TDMA frame time slot. After processed like this, the anti-interfering ability of the bits at both ends of TDMA frame time slot can be significantly enhanced, and the bit-error rate is decreased most, and all redundancy bits of Hamming codes can be arrayed at both ends of TDMA frame time slot.

BRIEF DESCRIPTION OF THE DRAWINGS

FIG. 4 illustrates interleaving of FIG. 3 through the $2^{nd}$ interleaving formula.

DETAILED DESCRIPTION OF THE INVENTION

With regard to the two existing issues, the present invention provides solutions as follows:

(1) In the existing technique, error correction capability can not be improved for data at both ends of TDMA frame time slot. The present technical solution provides twice ECC protection for data at both ends of TDMA frame time slot, and thus improves anti-interfering capability.

(2) In the existing technology, all redundancy bits of ECC cannot be distributed to the both ends of the frame time slot, whatever interleaving method is employed. The present invention provides a method for distributing all redundancy bits to the both ends of the frame time slot, and thus improving the capability of redundancy bits for anti-jamming, so as to protect the data at the both ends of the frame time slot.

With reference to the drawings and embodiments, the present invention is described in more detail. Embodiments carried out according to the invention are described as follows:

Firstly, establish a matrix in accordance with the length of valid information in TDMA frame time slot, and perform ECC on rows and columns of the matrix. The length of valid information bit processed by using said ECC corresponds to the number of rows and columns of said matrix.

Figure 1:
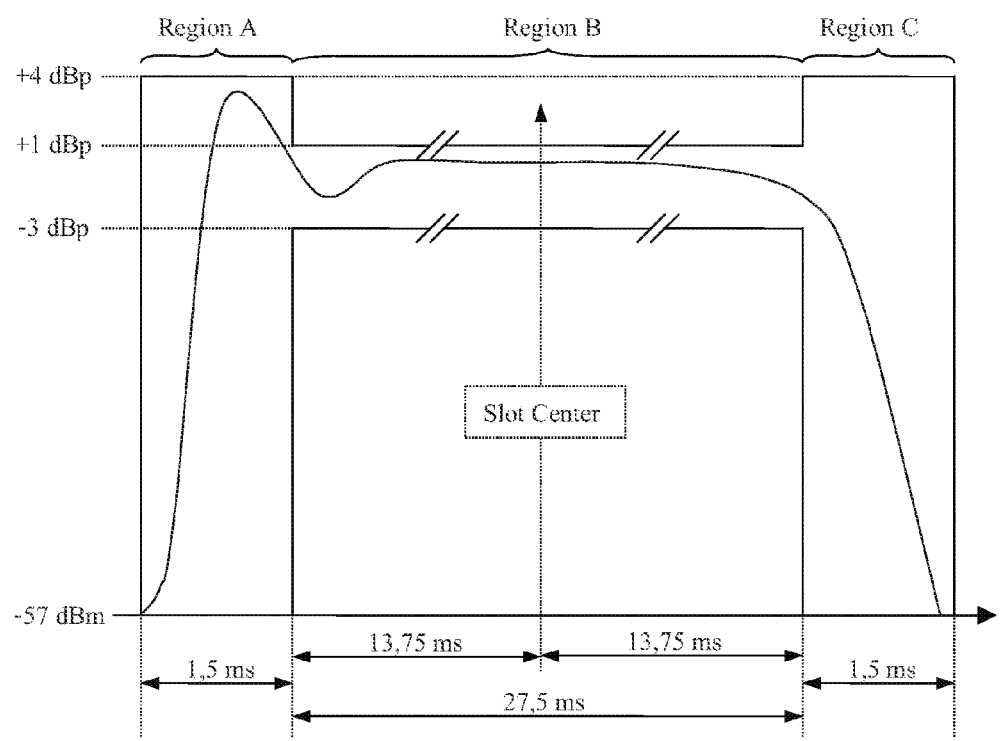
FIG. 1 is a chart for illustrating the relation between power and time in a time slot in a TDMA wireless communication system adopting existing technique.
Figure 2:
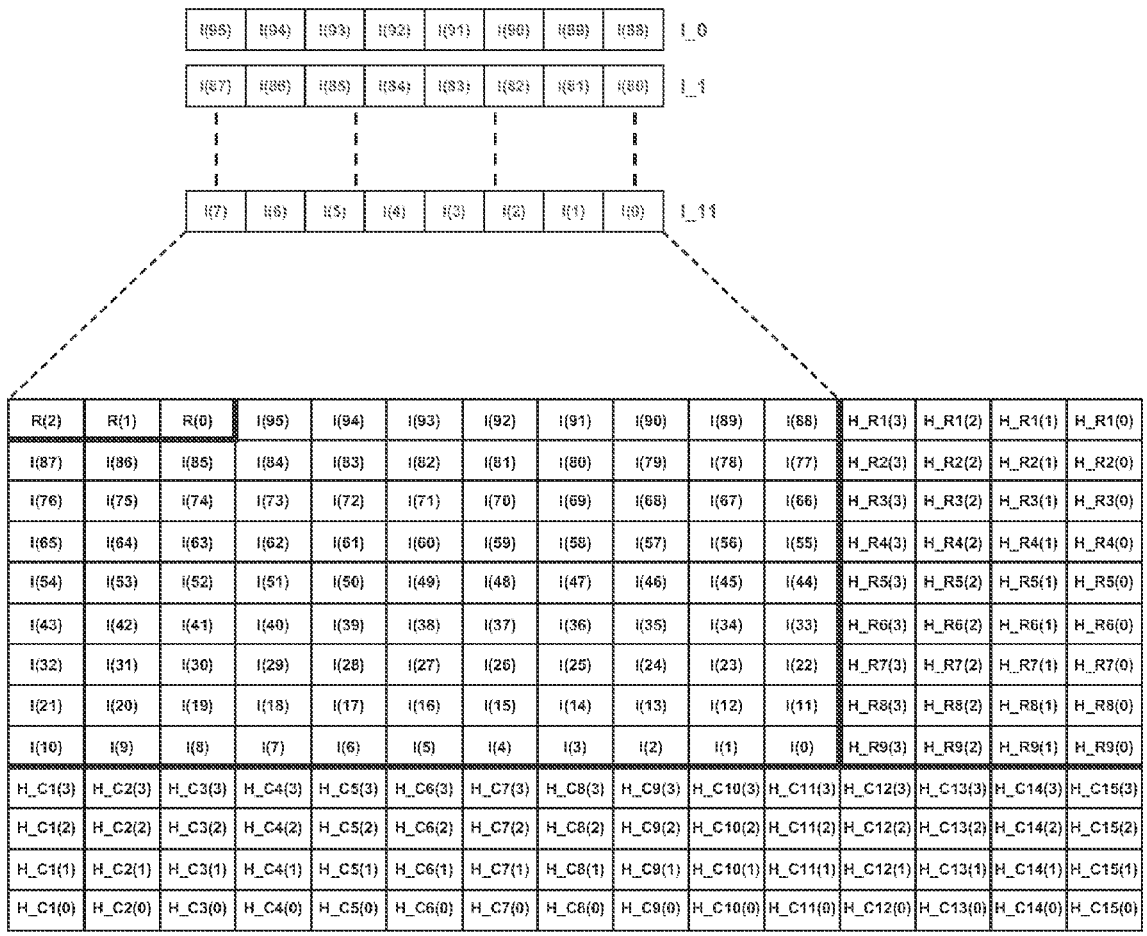
FIG. 2 is a schematical matrix diagram generated after coded through using BPTC in prior technique.
Figure 3:
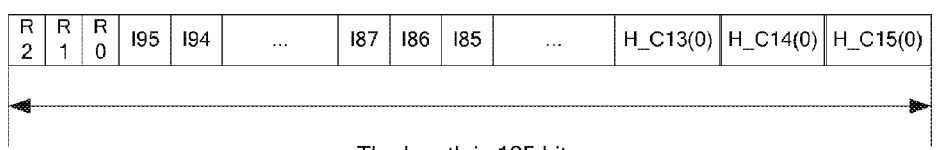
FIG. 3 illustrates interleaving of BPTC matrix of FIG. 2 generated from step I.

Supposing that the length of valid information bit in TDMA frame time slot is 96 bits, a prefix of three zeros is added to the 96 bits for forming 99 bits, which can be arranged into a 9×11 matrix. Rows of the matrix are processed by using Hamming codes (15, 11, 3) to get a 9×15 matrix, which will be further processed by using Hamming codes (13, 9, 3) to get a 13×15 matrix, as shown in FIG. 2. Wherein, I(0)-I(95) are information bits, H_R is the Error Correcting Code of Hamming codes (15, 11, 3), and H_C is the Error Correcting Code of Hamming codes (11, 9, 3). The above steps are same to those in the existing technique. Innovative aspects of the present invention lie in the following steps:

In said 13×15 matrix generated from the foregoing steps, some bits are processed twice by using Hamming code. They are firstly processed by using Hamming codes (15, 11, 3), and then processed by using codes (13, 9, 3). Positions of said bits are indicated in the block of FIG. 5.

Figure 5:
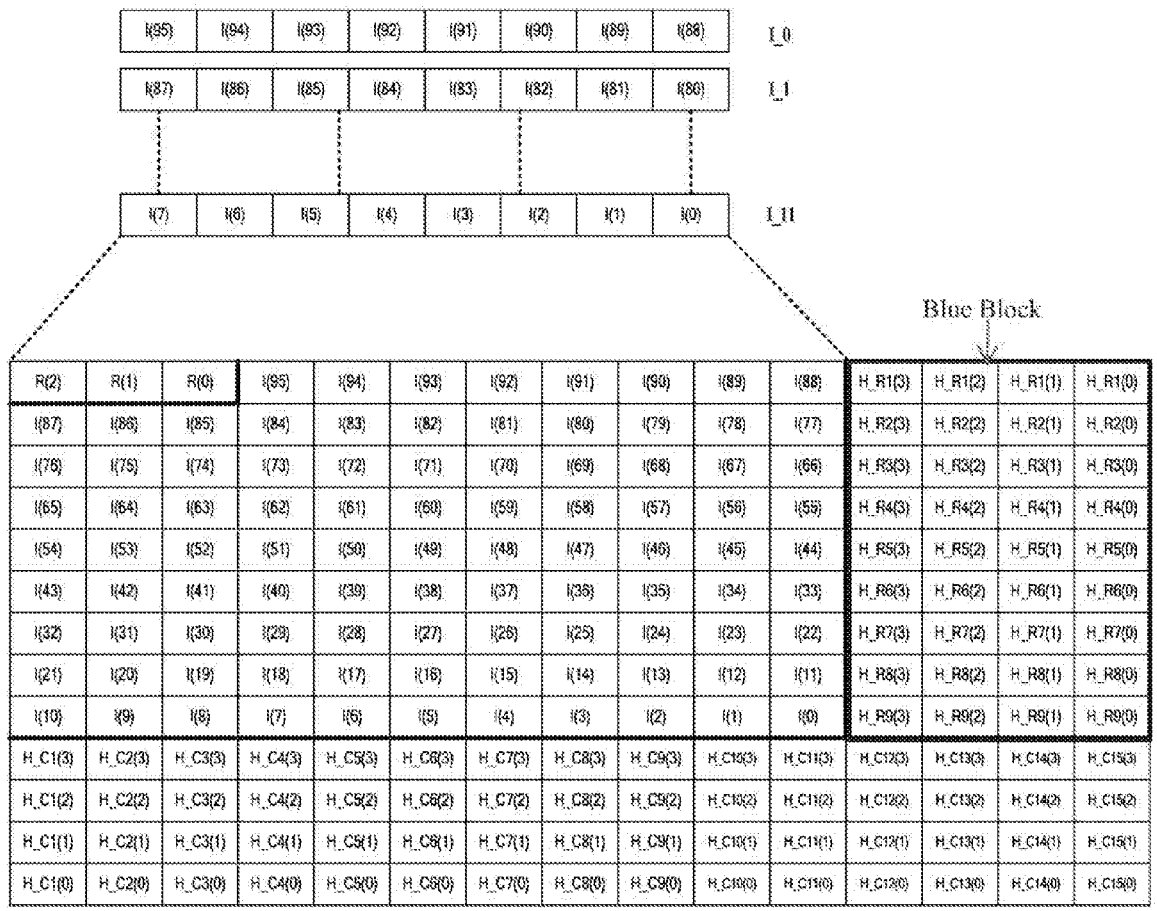
FIG. 5 illustrates ECC of some bits.

There are 36 bits totally in the block of FIG. 5, which are protected by using Hamming codes (15, 11, 3) and codes (11, 8, 3). Due to performing such protection corresponding to twice Hamming coding, the capability of said bits for anti-interfering can be improved.

If the 36 bits are filled totally to the both ends of TDMA frame time slot (Burst), with 18 bits per end, the time is:

$$\frac{18}{9600} \times 1000 = 1.875 \, ms$$

$1^{st}$ Interleaving method (method A in FIG. 6) should be adopted for bits in the blue block, for example, Interleave Index=Index×5 modulo 36

Interleave Index=Interleave Index+178(if Interleave Index>18)

Figure 6:
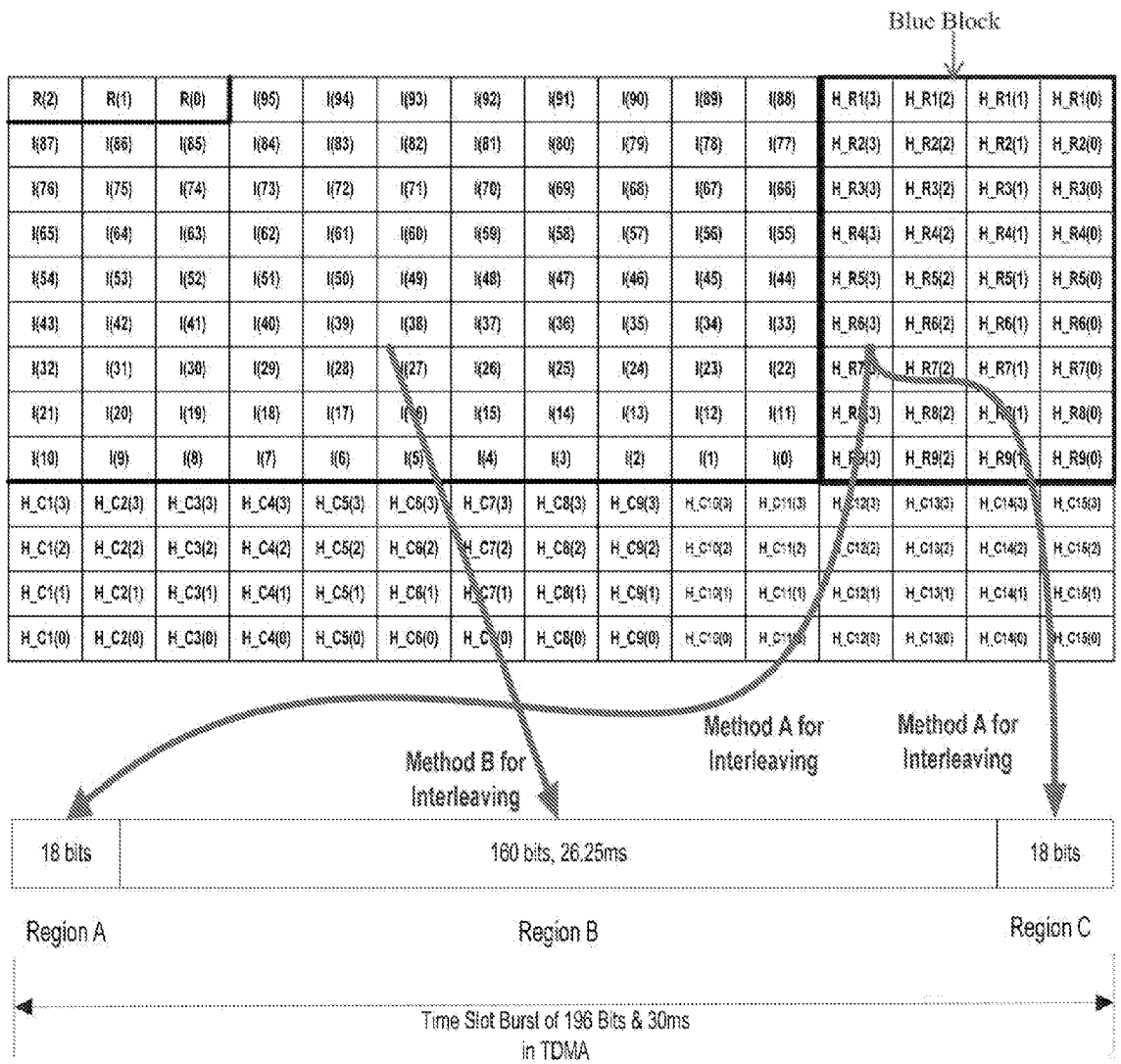
FIG. 6 illustrates the process for re-filling the remaining bits.

The remaining bits (which are out of the blue block) are arrayed from left to right and from top to bottom, and then interleaved through method B in FIG. 6. The interleaved bits are further disarranged, and then filled into the middle of the frame time slot. The interleaving method could be:

Interleave Index=Index×12 modulo 160+18

The detailed method of filling bits is shown as FIG. 6. The order at which bits in time slot in a TDMA frame are transmitted is totally different from that of existing technique. The redundancy bits which are processed twice by using ECC are totally filled into the both ends of frame time slot, so the capability of said bit for correcting error may be improved. Accordingly, sections that will be easily caused error at both ends of frame time slot are properly protected from interference.

In the present invention, BPTC coding could be replaced by other coding methods that could array bits of valid information into a n×m matrix. Hamming ECC of rows and columns of matrix could be replaced by other coding methods meeting with the requirements. Here, the length of valid information bit and the size of the matrix are used only for illustrating, and can be changed depending on the practical requirements.

In conclusion, the present technical solution re-arrays bits of valid information into a matrix, and performs Hamming coding on rows and columns of said matrix. So some bits are processed twice by Hamming ECC. Then, the twice processed bits are separated from the information bits, and disarranged by using 1st Interleaving method and arranged at the both ends of TDMA frame time slot (with being at VCO power rise/drop stage, the bits in this region can be easily interfered), meanwhile by adopting 2nd Interleaving method the remaining bits are arranged into the middle of TDMA frame time slot. After processed like this, the anti-interfering ability of the bits at both ends of TDMA frame time slot can be significantly enhanced, and the bit-error rate is decreased most, and all redundancy bits of Hamming codes can be arrayed at both ends of TDMA frame time slot.

The principles of the present invention are shown and described by referring mainly to exemplary preferred embodiments thereof. It will be apparent that the present invention is not limited to the specific embodiments disclosed herein. It will be understood by those skilled in the art that any changes and modifications may be made to the present invention without departing from the spirit and scope thereof. Any changes and modifications, equivalent replacement, and improvements made without departing from the spirit and scope of the present invention are intended to be included within the scope of claims of the present invention.

What is claimed is:

1. A method for enhancing reliability of information transmission, comprising the steps of:
   (a) establishing a matrix based on a length of valid information bits in frame time slots; and creating a new matrix by adding Error Correction Code (ECC) preset for rows and columns of said matrix respectively thereto;
   (b) adopting the $1^{st}$ Interleaving method to re-allocate bits which have been processed twice by said ECC in said new matrix, to both ends of said frame time slots; and
   (c) adopting the $2^{nd}$ Interleaving method to re-allocate the remaining bits in said new matrix to the middle of said frame time slots.

2. A method as claimed in claim 1, wherein the length of said valid information bits processed by using error correcting code in said step (a) corresponds to the number of rows and columns of said matrix.

3. A method as claimed in claim 1, wherein step (b) further includes two substeps of:
   (b1) performing comparison between bits which have been processed twice by using ECC in the new matrix;
   (b2) applying said $1^{st}$ Interleaving method to bits processed twice by using said ECC in the new matrix in case of meeting with requirements; otherwise, ending the process.

4. A method as claimed in claim 3, wherein said step (c) further includes 2 substeps of:
   (c1) arranging the remaining bits in said new matrix one by one in the order of left-to-right and top-to-bottom;
   (c2) applying said $2^{nd}$ Interleaving method to said remaining bits.

5. A method as claimed in claims 2, wherein Hamming code is employed.

6. A method as claimed in claims 3, wherein Hamming code is employed.

7. A method as claimed in claims 4, wherein Hamming code is employed.

8. A method as claimed in claim 2, wherein step (b) further includes two substeps of:
   (b1) performing comparison between bits which have been processed twice by using ECC in the new matrix;
   (b2) applying said 1st Interleaving method to bits processed twice by using said ECC in the new matrix in case of meeting with requirements; otherwise, ending the process.

9. A method as claimed in claim 1, wherein Hamming code is employed.

* * * * *